(12) United States Patent
Anil

(10) Patent No.: US 8,101,998 B2
(45) Date of Patent: Jan. 24, 2012

(54) MOSFET AND MANUFACTURING METHOD THEREOF

(75) Inventor: Kumar Anil, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 103 days.

(21) Appl. No.: 12/413,786

(22) Filed: Mar. 30, 2009

(65) Prior Publication Data
US 2009/0261413 A1 Oct. 22, 2009

(30) Foreign Application Priority Data
Apr. 22, 2008 (JP) ................. 2008-111127

(51) Int. Cl.
*H01L 27/12* (2006.01)
*H01L 21/762* (2006.01)

(52) U.S. Cl. ......... 257/347; 257/E21.561; 257/E27.112; 257/E29.255; 438/151

(58) Field of Classification Search .............. 257/347
See application file for complete search history.

(56) References Cited

U.S. PATENT DOCUMENTS

| | | | | |
|---|---|---|---|---|
| H896 H | * | 3/1991 | Szakasits et al. | 210/198.2 |
| 5,923,987 A | * | 7/1999 | Burr | 438/304 |
| 6,319,805 B1 | * | 11/2001 | Iwamatsu et al. | 438/592 |
| 6,635,542 B2 | * | 10/2003 | Sleight et al. | 438/311 |
| 6,908,820 B2 | | 6/2005 | Koyama | |
| 7,056,774 B2 | | 6/2006 | Koyama | |
| 7,220,645 B2 | | 5/2007 | Koyama | |
| 2002/0047183 A1 | * | 4/2002 | Shiiki et al. | 257/538 |
| 2006/0081930 A1 | * | 4/2006 | Maegawa et al. | 257/347 |
| 2008/0296676 A1 | * | 12/2008 | Cai et al. | 257/335 |

FOREIGN PATENT DOCUMENTS

| | | | | |
|---|---|---|---|---|
| JP | 06349854 A | * | 12/1994 | |
| JP | 06350042 A | * | 12/1994 | |
| JP | 2003-282879 A | | 10/2003 | |

* cited by examiner

*Primary Examiner* — N Drew Richards
*Assistant Examiner* — Robert Carpenter
(74) *Attorney, Agent, or Firm* — Volentine & Whitt, PLLC

(57) ABSTRACT

The present invention provides a MOSFET capable of improving the basic performance of a transistor such as saturation current characteristics, input follow-up and an offleak current at high levels, and a manufacturing method thereof. The MOSFET comprises a semiconductor layer, a gate electrode formed over the semiconductor layer through a gate oxide film interposed therebetween, a pair of drain/source regions each provided at a position where the regions interpose a channel region lying below the gate oxide film therebetween inside the semiconductor layer and each having a conductivity type different from a conductivity type of the semiconductor layer, a pair of extension regions which are respectively provided adjacent to the drain/source regions at the position and which are identical in conductivity type to the drain/source regions and lower in impurity concentration than the drain/source regions, and an interposition layer having a conductivity type different from the conductivity type of the source region, the interposition layer being provided adjacent only to the source region and the extension region adjacent thereto inside the semiconductor layer.

5 Claims, 1 Drawing Sheet

MOSFET AND MANUFACTURING METHOD THEREOF

BACKGROUND OF THE INVENTION

The present invention relates to a MOSFET and a manufacturing method thereof, and particularly to a MOSFET having an SOI structure.

In an SOI device, a semiconductor substrate layer and a transistor forming layer (i.e., SOI layer) formed thereon are insulated and separated from each other by an embedded oxide film. It is thus possible to perform insulation and separation between adjacent elements easily. Further, since no parasitic thyristor is formed through the semiconductor substrate layer, a latchup phenomenon can be prevented from occurring. Building a transistor into the SOI layer becomes effective in suppressing a so-called short channel effect that the characteristic of the transistor is deteriorated with its miniaturization. Further, since the junction capacitance of a transistor formed in an SOI structure is smaller than that of a transistor having a bulk structure, a high-speed operation is enabled. Thus, the transistor having the SOI structure has been expected as a device that has many excellent characteristics and is capable of achieving speeding-up and low power consumption as compared with a semiconductor element formed in a conventional bulk substrate.

In a MOSFET (hereinafter described as "SOI-MOSFET") having an SOI structure, high-concentration impurity doping is done on a channel region to prevent a reduction in the threshold voltage Vt due to a short channel effect and the occurrence of a punchthrough phenomenon. However, the high-concentration doping to the channel region yields a reduction in the mobility of carriers, thus resulting in the harmful effects of the saturation current of the MOSFET being reduced. In order to solve this problem, relatively high-concentration so-called Halo layers of a conductivity type different from that of source/drain regions are formed so as to surround the source and drain regions and extension regions provided at the ends of these in a state in which the impurity concentration of the channel region is kept low, thereby avoiding the occurrence of the punchthrough phenomenon or the like while the saturation current is being ensured (refer to a patent document 1 (Japanese Unexamined Patent Publication No. 2003-282879)).

In the MOSFET having the conventional structure, the Halo layers are formed at the ends of both of the drain and source regions in terms of ease of its manufacture. When, however, the relatively high-concentration layer is formed at the drain region end, an increase in the offleak current at a drain junction is incurred. As the required performance of the MOSFET, there may be mentioned a high saturation current, high input follow-up and a low offleak current. However, all the measures for performing improvements in saturation current characteristics cause even an increase in the offleak current, thus encountering difficulties in balancing these with each other at high levels.

SUMMARY OF THE INVENTION

The present invention has been made in terms of the foregoing. It is therefore an object of the present invention to provide a MOSFET capable of improving the basic performance of a transistor such as saturation current characteristics, input follow-up and an offleak current at high levels, and a manufacturing method thereof.

According to one aspect of the present invention, for attaining the above object, there is provided a MOSFET comprising a semiconductor layer, a gate electrode formed over the semiconductor layer through a gate oxide film interposed therebetween, a pair of drain/source regions each provided at a position where the regions interpose a channel region lying below the gate oxide film therebetween inside the semiconductor layer and each having a conductivity type different from a conductivity type of the semiconductor layer, a pair of extension regions which are respectively provided adjacent to the drain/source regions at the position and which are identical in conductivity type to the drain/source regions and lower in impurity concentration than the drain/source regions, and an interposition layer having a conductivity type different from the conductivity type of the source region, the interposition layer being provided adjacent only to the source region and the extension region adjacent thereto inside the semiconductor layer.

According to another aspect of the present invention, for attaining the above object, there is provided a method for manufacturing the MOSFET having the above configuration, comprising the steps of forming the gate oxide film over the semiconductor layer by thermal oxidation; depositing a gate electrode material over the gate oxide film, patterning the gate electrode material to form the gate electrode; implanting impurity ions in the semiconductor layer with the gate electrode as a mask thereby to form the pair of extension regions; forming, over the semiconductor layer, a photomask having an opening at a portion corresponding to the source region and having no opening at a portion corresponding to the drain region; implanting impurity ions in the semiconductor layer exposed from the opening of the photomask from an oblique direction thereby to form the interposition layer; after removal of the photomask, forming sidewalls each comprised of an insulator over sidewall portions of the gate electrode; and implanting impurity ions in the semiconductor layer with the gate electrode and the sidewalls as masks thereby to form the pair of drain/source regions.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
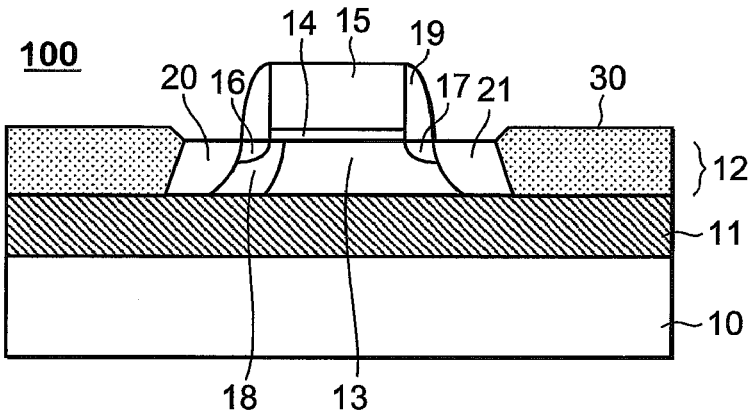
FIG. 1 is a sectional structure diagram of an SOI-MOSFET showing an embodiment of the present invention.

Preferred embodiments of the present invention will hereinafter be described with reference to the accompanying drawings. In the drawings shown below, the same reference numerals are respectively attached to components or parts substantially identical or equal to one another. In the following, a description will be made, as an example, of the case where the present invention is applied to an n channel MOSFET. FIG. 1 is a sectional structure diagram of an SOI-MOSFET 100 showing a preferred embodiment of the present invention.

The SOI-MOSFET 100 has a laminated structure in which an embedded oxide film 11 is formed on a silicon substrate layer 10 and an SOI layer 12 is formed on the embedded oxide film 11. The embedded oxide film 11 is comprised of, for example, an SiO$_2$ film and insulates and separates the silicon substrate 10 and the SOI layer 12 from each other. The thickness of the embedded oxide film 11 ranges from 1000 Å to 4000 Å, for example. The SOI layer 12 is of a p-type semiconductor layer whose thickness ranges from 300 Å to 1000 Å, for example. Active regions of the SOI-MOSFET 100 are formed in the SOI layer 12. The MOSFET formed in the SOI layer 12 is completely insulated and separated from other elements by the embedded oxide film 11 and device isolation layers 30 formed at its both ends.

A gate electrode 15 comprised of, for example, polysilicon or the like is formed over the SOI layer 12 via an about 20-50 Å gate oxide film 14 interposed therebetween. Sidewalls 19 each comprised of an insulator such as SiO$_2$ are formed on their corresponding sidewall portions of the gate electrode 15.

An n-type source 20 and an n-type drain 21 are formed in the SOI layer 12 so as to interpose the gate electrode 15 therebetween by the implantation of a relatively high-concentration impurity therein. n-type extension regions 16 and 17 each relatively low in impurity concentration are formed at their corresponding ends of the source 20 and drain 21 along the surface of the SOI layer. Inserting the extension regions between a channel region 13 lying directly below the gate electrode and the source and drain relaxes an electric field in the neighborhood of a drain end, enhances a breakdown voltage at a drain junction and prevents a threshold voltage Vt from being reduced due to a short channel effect.

Further, a p-type interposition layer 18 relatively high in impurity concentration is formed on the source 20 side adjacent to the source 20 and the source extension region 16. In the SOI-MOSFET of the present invention, the interposition layer is formed only on the source side, but not formed on the drain side. There is a case where when a channel length becomes short in the MOSFET, a drain depletion layer expands to a source region and is connected to a source depletion layer, thereby causing a punchthrough phenomenon that current (punchthrough current) flows in a source-to-drain region other than the original channel. The punchthrough phenomenon is one short channel effect and deteriorates gate-based controllability, i.e., the input follow-up of a transistor due to the punchthrough current. Therefore, an interposition layer 18 of a conductivity type different from these conductivity types is provided adjacent to the source 20 and the extension region 16 thereby to suppress the spread of the depletion layer and prevent the occurrence of the punchthrough phenomenon. Although the interposition layer 18 is introduced to prevent the occurrence of the punchthrough phenomenon in this way, the connection of the depletion layer between the drain and source may be simply prevented. The provision of the interposition layer on both source and drain sides is not essential. On the other hand, when a relatively high-concentration interposition layer is provided adjacent to the drain end, an increase in the offleak current at the drain junction is incurred. The SOI-MOSFET of the present invention is configured as a structure in which from such a standpoint, the interposition layer is provided only on the source side and no interposition layer is provided on the drain side. It is thus possible to prevent the occurrence of the punchthrough phenomenon and avoid the problem of the increase in the offleak current at the drain junction with the introduction of the interposition layer.

A method of manufacturing the SOI-MOSFET 100 having the above structure will next be explained with reference to FIG. 2.

An SOI substrate is first prepared. The SOI substrate may be one produced or formed by a method like a bonding method or an SIOX (Silicon Implanted Oxide) method or the like. Incidentally, in the SIOX method, oxygen O$_2$ (1E18 cm$^{-2}$, for example) of high energy (180 KeV, for example) and a high concentration is ion-implanted from the surface of a prime wafer and thereafter the injected oxygen and silicon are caused to react by heat treatment, thereby forming a SiO$_2$ film (embedded oxide film) inside of the neighborhood of the wafer surface. On the other hand, in the bonding method, a wafer formed with an SiO$_2$ film at its surface and another wafer are bonded to each other by heat and pressure, and one-side silicon is ground and removed halfway, thereby forming an SOI substrate. In the present embodiment, an SOI substrate is used in which the thickness of an embedded oxide film 11 ranges from 1000 Å to 2000 Å, for example, and the thickness of an SOI layer 12 ranges from 300 Å to 1000 Å, for example (FIG. 2(a)).

Element separation regions 30 each comprised of SiO$_2$ or the like are formed in the SOI layer 12 using, for example, the known LOCOS (Local Oxidation of Silicon) method. Subsequently, a gate oxide film 14 having a thickness ranging from about 20 Å to 50 Å is formed on the SOI layer 12 by a thermal oxidation method. The gate oxide film 14 may be an SiON film or an HFO$_2$ film other than the SiO$_2$ film. Then, boron ion implantation for adjusting a threshold voltage Vth is performed on the gate oxide film 14. This is referred to as so-called channel dope. A dopant gas used upon this ion implantation is BF$_2$, for example, and implantation conditions are as follows: The dose ranges from $3\times10^{12}$ cm$^{-2}$ to $2\times10^{13}$ cm$^{-2}$, for example and the implantation energy ranges from 10 KeV to 20 KeV, for example. Boron ions are implanted in the surface of the SOI layer 12 via the gate oxide film 14 (FIG. 2(b)).

Next, polysilicon 15 that constitutes a gate electrode is deposited over the entire surface of the SOI substrate at, for example, about 1000 to 2000 Å by a known CVD method. After the deposition of the polysilicon, for example, high-concentration phosphorus may be doped thereto to control the resistance value of the gate electrode. Incidentally, a metal such as tungsten may be used as a gate electrode material in addition to the polysilicon. Subsequently, a photoresist is applied onto the deposited polysilicon to form a photomask through exposure and development. The polysilicon and gate oxide film at an opened portion of the photomask are eliminated by anisotropic dry etching such as plasma etching, and patterning is done on the gate electrode 15 (FIG. 2(c)).

Figure 2A:
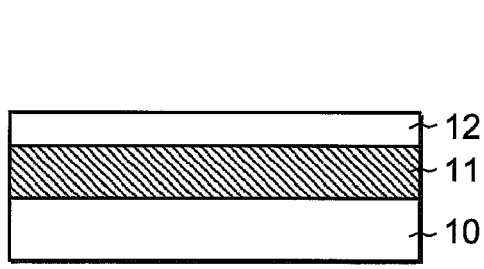
FIGS. 2(a) through 2(f) are respectively diagrams showing a manufacturing process of the SOI-MOSFET illustrative of the embodiment of the present invention.
Figure 2B:
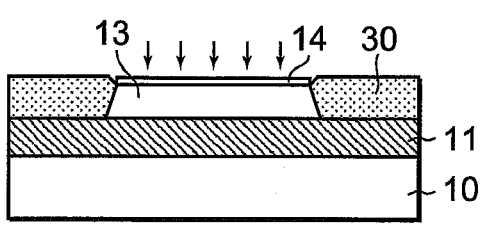
Figure 2C:
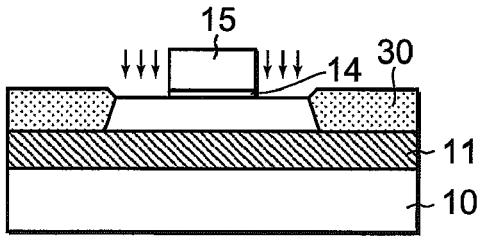
Figure 2D:
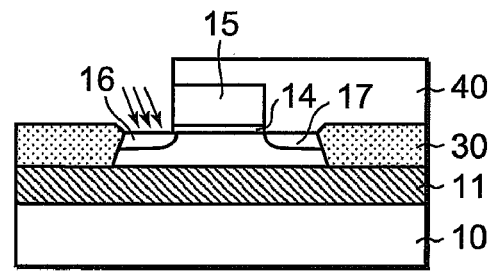

With the gate electrode 15 subjected to the patterning as a mask, for example, arsenic ions are next implanted in the surface of the SOI layer 12 thereby to form shallow n-type extension regions 16 and 17 relatively low in impurity concentration in the surface of the SOI layer 12 with the gate electrode 15 interposed therebetween (FIG. 2(d)). That is, the extension regions 16 and 17 are formed on a self-alignment basis with respect to the gate electrode 15. Ion implantation conditions in the present process are as follows: The dose ranges from 1 to $7\times10^{14}$ cm$^{-2}$, for example, and the implantation energy ranges from 3 to 5 KeV, for example. Incidentally, other n-type conductive impurities such as phosphorus, antimony, etc. may be used as implantation ions.

Next, a photomask 40 having an aperture or opening only in the source region is formed over the SOI substrate. That is, the upper portion of the drain region is covered with the photomask 40. Then, boron ion implantation is performed on the SOI layer 12 exposed from the opening of the photomask 40 thereby to form a relatively high-concentration p-type interposition layer 18 so as to surround the side and bottom faces of the extension region 16 on the source side (FIG. 2(e)). A dopant gas used upon this ion implantation is $BF_2$, for example. The ion implantation is conducted under the implantation conditions that the dose ranges from $8\times10^{12}$ $cm^{-2}$ to $3\times10^{13}$ $cm^{-2}$, for example, the implantation energy ranges from 20 KeV to 40 KeV, for example, and the tilt angle ranges from 30 degrees to 40 degrees, for example. Incidentally, other p-type conductive impurities other than boron may be used as implantation ions. The photomask 40 formed on the SOI substrate to form the interposition layer is thereafter eliminated from on the SOI substrate through an oxygen plasma ashing step and a cleaning step using an acid solution.

Figure 2E:
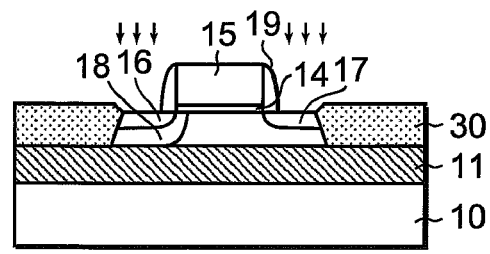
Figure 2F:
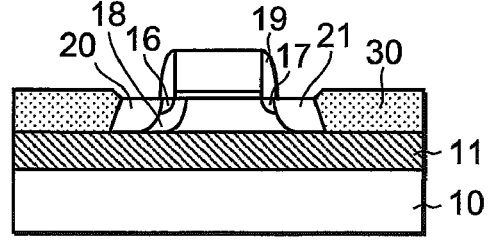

Next, an insulating film such as $SiO_2$ is deposited over the entire surface of the SOI substrate by a CVD method and thereafter etched-back by reactive ion etching thereby to form sidewalls 19 on their corresponding sidewall portions of the gate electrode 15 (FIG. 2(e)).

Next, for example, phosphorus ions are implanted in the SOI layer 12 with the gate electrode 15 and the sidewalls 19 as masks thereby to form an n-type drain 21 and an n-type source 20 both relatively high in concentration. Namely, the drain 21 and the source 20 are formed on a self-alignment basis with respect to the gate electrode 15. The ion implantation conditions in the present process are as follows: The dose ranges from $1\times10^{15}$ $cm^{-2}$ to $5\times10^{15}$ $cm^{-2}$, for example, and the implantation energy ranges from 3 KeV to 10 KeV, for example. Incidentally, other n-type conductive impurities such as arsenic, antimony, etc. may be used as implantation ions in addition to the phosphorus. Subsequently, the SOI substrate is subjected to RTA (Rapid Thermal Anneal) at 950 to 1000° C. for about 1 to 10 seconds using an annealer of an infrared lamp heating system thereby to recover damage of crystals of the post-ion implantation SOI layer 12 (FIG. 2(f)).

The SOI-MOSFET 100 is completed through the above process steps. Thus, according to the SOI-MOSFET 100 of the present invention, it is possible to suppress the expansion of the depletion layer on the source side because the interposition layer 18 is provided between the source 20 and extension region 16 and the channel region. Therefore, the punchthrough phenomenon corresponding to one short channel effect can be prevented from occurring. The SOI-MOSFET of the present invention is considered to be sufficient as one for a punchthrough prevention effect although the interposition layer is provided only on the source side. It is hence considered that the input follow-up of the transistor is ensured. Thus, the high-concentration doping to the channel region for punchthrough prevention becomes unnecessary, and a reduction in the saturation current can also be prevented. Further, since the SOI-MOSFET of the present invention is set to such a structure that no interposition layer is provided on the drain side, it is possible to avoid an increase in the offleak current at the drain junction and improve the switching characteristics of the transistor. Namely, according to the SOI-MOSFET of the present invention, the basic performance of the transistor such as the saturation current characteristics, input follow-up and offleak current can be improved at high levels.

While the preferred forms of the present invention have been described, it is to be understood that modifications will be apparent to those skilled in the art without departing from the spirit of the invention. The scope of the invention is to be determined solely by the following claims.

What is claimed is:

1. A MOSFET comprising:
    a semiconductor layer;
    a gate electrode formed over the semiconductor layer;
    a gate oxide film interposed between the semiconductor layer and the gate electrode;
    source and drain regions located in the semiconductor layer and spaced apart to define a channel region therebetween in the semiconductor layer below the gate oxide film, the source and drain regions each having a conductivity type which is different from a conductivity type of the channel region in the semiconductor layer;
    a first extension region which extends at an upper surface region of the semiconductor layer into the channel region from the source region, the first extension region having a same conductivity type and a lower impurity concentration than the source region;
    a second extension region which extends at an upper surface region of the semiconductor layer into the channel region from the drain region, the second extension region having a same conductivity type and a lower impurity concentration than the drain region; and
    an interposition layer interposed between the channel region and the source and first extension regions, and extending from an upper surface to a lower surface of the semiconductor layer, the interposition layer having a conductivity type which is different from the conductivity type of the source region, wherein the MOSFET is devoid of another interposition layer between the channel region and the drain and second extension regions.

2. The MOSFET according to claim 1, wherein the semiconductor layer is an SOI layer formed over an embedded oxide film, and wherein the interposition layer contacts the embedded oxide film.

3. A method of manufacturing the MOSFET according to claim 1 or 2, comprising the steps of:
    forming the gate oxide film over the semiconductor layer by thermal oxidation;
    depositing a gate electrode material over the gate oxide film;
    patterning the gate electrode material to form the gate electrode;
    implanting impurity ions in the semiconductor layer with the gate electrode as a mask to form the first and second extension regions;
    forming, over the semiconductor layer, a photomask having an opening at a portion corresponding to the source region and having no opening at a portion corresponding to the drain region;
    implanting impurity ions in the semiconductor layer exposed from the opening of the photomask from an oblique direction to form the interposition layer;
    after removal of the photomask, forming sidewalls each comprised of an insulator over sidewall portions of the gate electrode; and
    implanting impurity ions in the semiconductor layer with the gate electrode and the sidewalls as masks thereby to form the source and drain regions.

4. The method according to claim 3, further including a step for implanting impurity ions in the semiconductor layer after the formation of the gate oxide film and before the deposition of the gate electrode material to adjust a threshold voltage of the MOSFET.

5. The MOSFET according to claim 2, wherein the source region contacts the embedded oxide film adjacent the interposition layer.

* * * * *